United States Patent [19]

Agoston

[11] Patent Number: 4,736,380

[45] Date of Patent: Apr. 5, 1988

[54] LASER DIODE DRIVER

[75] Inventor: Agoston Agoston, Beaverton, Oreg.

[73] Assignee: Tektronix, Inc., Beaverton, Oreg.

[21] Appl. No.: 858,405

[22] Filed: Apr. 30, 1986

[51] Int. Cl.[4] .............................................. H01S 3/096
[52] U.S. Cl. ..................................... 372/38; 307/311;
307/319; 372/25; 372/26
[58] Field of Search ............................ 372/38, 25, 26;
307/311, 318, 319, 320

[56] References Cited

U.S. PATENT DOCUMENTS

| | | | |
|---|---|---|---|
| 3,527,966 | 9/1970 | Forge | 307/319 |
| 3,622,808 | 11/1971 | Uchida et al. | 307/319 |
| 3,624,416 | 11/1971 | Bleickardt | 307/319 |
| 4,060,739 | 11/1977 | Russer et al. | 307/319 |
| 4,101,845 | 7/1978 | Russer | 372/26 |
| 4,427,895 | 6/1981 | Eng | 455/610 |

Primary Examiner—James W. Davie
Attorney, Agent, or Firm—Daniel J. Bedell; Robert S. Hulse

[57] ABSTRACT

A reverse current transmitted through an initially forward biased step-recovery diode causes the step-recovery diode to switch from the forward biased state to a reverse biased state, thereby developing an abruptly rising reverse bias voltage across the step-recovery diode. The abruptly rising reverse bias voltage is applied across a series combination of a capacitor and a laser diode, connected in parallel with the step-recovery diode to force a short, abrupt forward current pulse through the laser diode, thereby causing the laser diode to emit a short optical pulse.

8 Claims, 2 Drawing Sheets

LASER DIODE DRIVER

BACKGROUND OF THE INVENTION

The present invention relates in general to optical pulse generates and in particular to a driver circuit for a laser diode producing an optical pulse.

Optical pulses are useful in a variety of applications. What is needed and would be useful is an apparatus for producing a short, abrupt electric current pulse through a laser diode abrupt optical pulse.

SUMMARY OF THE INVENTION

In accordance with one aspect of the invention, an optical pulse is generated by transmitting a short, abrupt current pulse through a laser diode. A reverse current transmitted through an initially forward biased step-recovery diode causes the step-recovery diode to switch from the forward biased state to a reverse biased state thereby producing an abruptly rising reverse bias voltage across the step-recovery diode. This abruptly rising voltage is applied across a series combination of a capacitor and a laser diode, connected in parallel with the step-recovery diode, and produces the abrupt current pulse through the laser diode the current pulse causing the laser diode to emit a short, abrupt optical pulse.

It is accordingly an object of the invention to provide a new and improved method and apparatus for producing a short, abrupt light pulse.

The subject matter of the present invention is particularly pointed out and distinctly claimed in the concluding portion of this specification. However, both the organization and method of operation, together with further advantages and objects thereof, may best be understood by reference to the following description taken in connection with the accompanying drawings wherein like reference characters refer to like elements.

DETAILED DESCRIPTION

Figure 1:
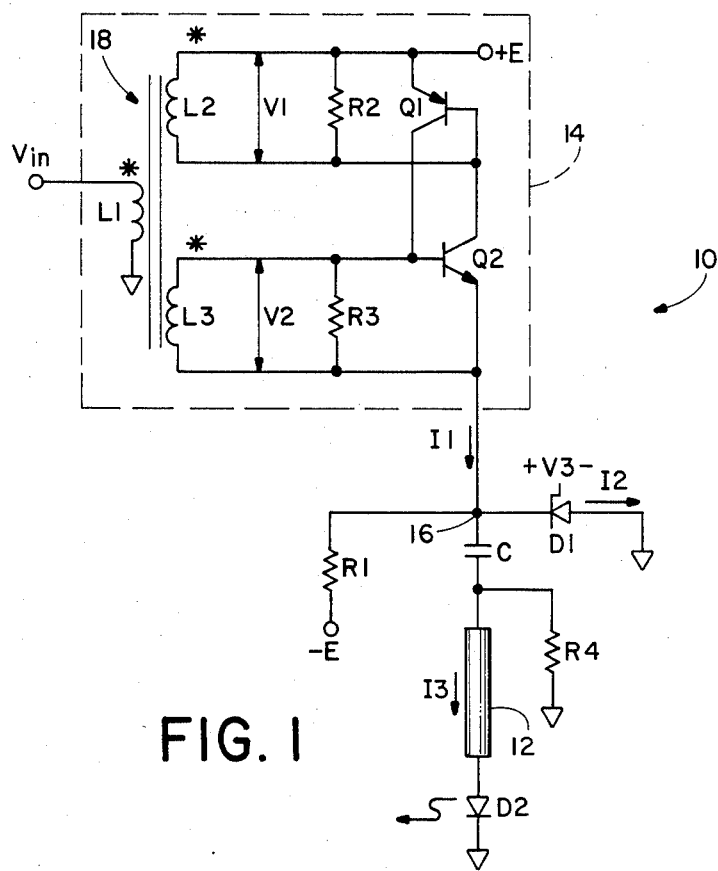
FIG. 1 is a schematic diagram of the laser diode driver circuit according to the present invention.

Referring to FIG. 1, there is depicted in schematic diagram form a laser diode driver circuit 10 according to the present invention, adapted to produce a current pulse through a laser diode D2 which causes diode D2 to emit a short, abrupt optical pulse. The driver circuit 10 includes a step-recovery diode D1 which stores charge while conducting in the forward direction. When a current is transmitted in the reverse direction through the step-recovery diode D1, the diode D1 conducts in the reverse direction for a short time as the stored charge is dispelled by the reverse current. Once the stored charge has been fully dispelled, the step-recovery diode D1 abruptly cuts off the reverse current flow, thereby producing a fast rising reverse bias voltage across the step recovery diode. This fast rising voltage is used to generate the current pulse through the laser diode D2.

The anode of step-recovery diode D1 is grounded while its cathode is connected through a capacitor C and a transmission line 12 to the anode of laser diode D2. The cathode of laser diode D2 is grounded. The cathode of the step-recovery diode D1 is also connected through a resistor R1 to a source of negative voltage ($-E$) and to the output terminal of a current generator 14. Current generator 14 is adapted to produce a fast rising output current I1 when triggered by an input voltage pulse Vin and this current I1 is injected into a node 16 between the cathode of step-recovery diode D1 and capacitor C. During steady state operation, when the output current I1 of current generator 14 is turned off, the negative voltage source ($-E$), acting through resistor R1, maintains the step-recovery diode D1 in a forward biased state. When the current generator 14 subsequently produces its output current I1 following an input voltage pulse Vin, most of current I1 is transmitted as a current I2 in the reverse direction through the step-recovery diode D1 since the charge stored in step-recovery diode D1 make the diode a low impedance path to ground. However the reverse current I2 quickly depletes the stored charge in the step-recovery diode D1 and when the charge stored in the step-recovery diode is fully depleted, the step-recovery diode D1 abruptly cuts off the reverse current I2 and a rapidly rising reverse bias voltage V3 is developed across the step-recovery diode. The voltage V3 also develops across the series combination of capacitor C, transmission line 12 and laser diode D2, thereby forcing a current pulse I3 through the laser diode D2 and causing the laser diode to emit a short, abrupt optical pulse. Current pulse I3 rises abruptly but falls rapidly as capacitor C charges. A resistor R4, connecting the junction between transmission line 12 and capacitor C to ground and having a resistance equal to the characteristic impedance of transmission line 12, is provided to back terminate transmission line 12 so as to absorb signal reflections from the diode D2.

The current pulse generator 14 includes a complementary transistor pair Q1 and Q2 connected to form a bistable multivibrator. Transistor Q1 is a PNP transistor and Q2 is an NPN transistor. The base of transistor Q2 is coupled to the collector of transistor Q1 while the base of transistor Q1 is coupled to the collector of transistor Q2. A positive voltage source ($+E$) is connected to the emitter of transistor Q1. The emitter of transistor Q2, connected to the cathode of the step recovery diode D1, provides the current I1 output of the current generator 14. The current generator 14 also includes a transformer 18 having a primary coil L1 and a pair of secondary coils L2 and L3. The secondary coil L2 and a resistor R2 are connected in parallel between the emitter and base of transistor Q1 while the secondary coil L3 and another resistor R3 are connected in parallel between the base and the emitter of transistor Q2. The input voltage pulse Vin is applied across the primary coil L1 of transformer 18.

Prior to occurrence of an input voltage pulse Vin, the conductors L2 and L3 provide short circuit DC paths from the bases of transistors Q1 and Q2 to their emitters which maintain each transistor Q1 and Q2 in an off state. Thus the current I1 output of the current generator 14, supplied through the emitter of transistor Q2, is turned off. To initiate an output current, the input voltage pulse Vin is applied across the transformer 18 primary coil L1 thereby inducing short voltage pulses V1 and V2 across the secondary coils L2 and L3. The V1 pulse turns on transistor Q1 at the same time that the V2 pulse turns on transistor Q2 and positive feedback from the collector of each transistor to the base of the other transistor rapidly drives the transistors Q1 and Q2 into saturation wherein transistor Q2 rapidly increases the output current I1 to the step-recovery diode D1.

The reverse current I2 drawn by the step recovery diode D1 maintains transistors Q1 and Q2 in the saturated state until the step-recovery diode D1 cuts off its reverse current I2. Thereafter the current I3 drawn by capacitor C keeps the transistors Q1 and Q2 switched on for a short time, until the charging of capacitor C3 causes current I3 to fall to a level which is too low to keep transistors Q1 and Q2 on. Transistors Q1 and Q2 then turn off, driving current I1 to zero, and the negative voltage source (−E) switches the step-recovery diode D1 back to the forward bias state.

Figure 2:
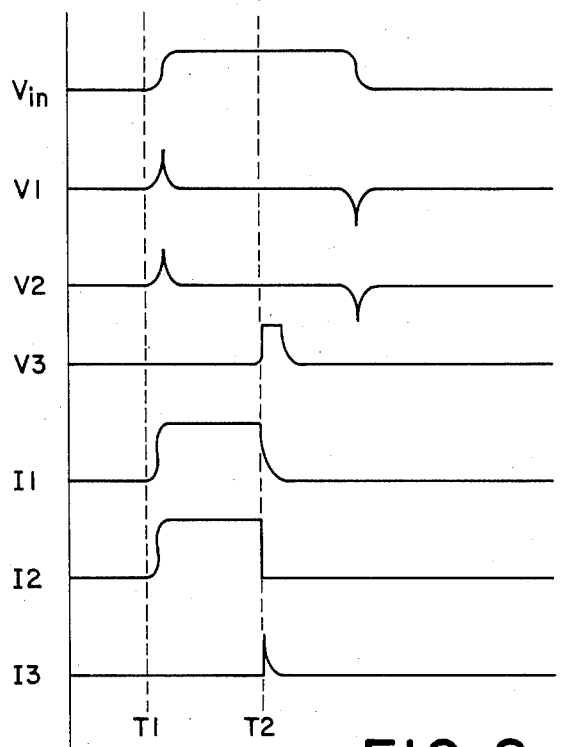
FIG. 2 is a timing diagram illustrating timing relationships between signals of the circuit of FIG. 1.

FIG. 2 is a timing diagram of the Vin, V1–V3 and I1–I3 signals of the diode driver circuit 10 of FIG. 1. At time T1 the Vin signal input to the current generator 14 is driven high, thereby producing the voltage pulses V1 and V2 across the transformer secondary coils. As transistors Q1 and Q2 turn on, the output current I1 of the current pulse generator 14 is driven high. At time T2 the charge in the step-recovery diode D1 is fully depleted and current I2 is abruptly cut off, and the reverse bias voltage V3 across the step recovery diode rapidly increases. The voltage V3 drives the current pulse I3 through capacitor C and diode D2 causing D2 to emit the light pulse and currents I1 and I3 fall rapidly as the capacitor charges. Thereafter V3 falls to its forward bias value as current generator 14 turns off. When the Vin pulse subsequently turns off reverse polarity voltage pulses V1 and V2 are included across coils L1 and L2, but these pulses do not affect the switching states of Q1 and Q2.

With +E and −E voltage source magnitudes of +15 volts and −15 volts, the peak amplitude of the output current I1 of current generator 14 is approximately 500 milliamps and the magnitude of the reverse bias voltage V3 produced when step recovery diode D1 switches off current I2 is in the range of 10 to 20 volts, with a rise time of 35–50 picoseconds. The duration of the current pulse I3 produced in response to the voltage V3 is approximately 200 to 400 picoseconds. Thus the laser diode driver circuit 10 of the present invention produces an abruptly rising, short duration current pulse I3 through the laser diode D2 which causes the laser diode to produce a short, high intensity optical pulse output.

While a preferred embodiment of the present invention has been shown and described, it will apparent to those skilled in the art that many changes and modifications may be made without departing from the invention in its broader aspects. The appended claims are therefore intended to cover all such changes and modifications as fall within the true spirit and scope of the invention.

I claim:

1. An apparatus for producing an optical pulse comprising:
   a capacitor connected to a circuit node,
   a laser diode connected in series with said capacitor to a first reference potential node,
   a step-recovery diode connected between said circuit node and a second reference potential node, and
   means for switching said step-recovery diode from a forward bias state to a reverse bias state such that an abruptly changing reverse bias voltage develops at said circuit node, thereby causing a current pulse to pass through said laser diode, said current pulse causing said laser diode to emit an optical pulse.

2. The apparatus according to claim 1 wherein said means for switching comprises:
   means for forward biasing said step-recovery diode, and
   means for selectively transmitting a reverse current through said step-recovery diode, said reverse current switching said step-recovery diode from said forward bias state to said reverse bias state.

3. The apparatus according to claim 2 wherein said means for selectively transmitting a reverse current through said step-recovery diode comprises a bistable multivibrator circuit.

4. An apparatus for producing an optical pulse comprising:
   a capacitor connected to a circuit node,
   a laser diode connected in series with said capacitor to a first reference potential node,
   a step-recovery diode connected between said circuit node and a second reference potential node,
   a voltage source,
   a resistor connecting said voltage source to said circuit node for forward biasing said step-recovery diode,
   first and second complementary transistors, the base of the first transistor being connected to the collector of the second transistor and the base of the second transistor being connected to the collector of the first transistor, the emitter of said second transistor being connected to said circuit node,
   a first inductor coupling the base and collector of said first transistor,
   a second inductor coupling the base and collector of said second transistor, and
   means for inducing voltage pulses across said first and second inductors, said voltage pulses turning on said first and second transistors such that said second transistor increases an emitter current to said circuit node, thereby causing said step-recovery diode to switch from a forward bias state to a reverse bias state.

5. An apparatus for producing an abruptly changing output voltage comprising:
   a step-recovery diode,
   biasing means for forward biasing the step recovery diode, and
   a bistable multivibrator for producing an output current in response to an input signal, said output current being transmitted in a reverse direction through said step-recovery diode, said biasing means forward biasing said step-recovery diode until said bistable multivibrator produces said output current, said output current causing said step-recovery diode to switch from a forward bias state to a reverse biased state, wherein said abruptly changing voltage is developed across said step-recovery diode.

6. An apparatus for producing an abruptly changing output voltage comprising:
   first and second complementary transistors, the base of the first transistor being connected to the collector of the second transistor and the base of the second transistor being connected to the collector of the first transistor,
   a first inductor coupling the base and the collector of said first transistor,
   a second inductor coupling the base and collector of said second transistor, means for inducing voltage pulses across said first and second inductors, thereby turning on said first and second transistors, a step-recovery diode, the emitter of said second transistor supplying a reverse current through said step-recovery diode when said first and second transistors are turned on, and means for maintaining said step-recovery diode in a forward biased state when said first and second transistors are turned off.

7. An apparatus for producing an abruptly changing output voltage comprising:
  a PNP transistor having a base, an emitter, and a collector,
  an NPN transistor having a base, an emitter, and a collector, the base of said PNP transistor being connected to the collector of said NPN transistor, the base of said NPN transistor being connected to the collector of said PNP transistor,
  a first inductor coupling the base and the collector of said PNP transistor,
  a second inductor coupling the base and the collector of said PNP transistor,
  a positive voltage source connected to the emitter of said PNP transistor,
  a step-recovery diode having a cathode connected to the emitter of said NPN transistor,
  a negative voltage source resistively coupled to the cathode of said step-recovery diodes, and
  means for inducing simultaneous voltage pulses across said first and second inductors, thereby turning on said NPN and PNP transistors, said PNP transistor emitter thereupon supplying current to the cathode of said step-recovery diode, said current driving said step-recovery diode from a forward bias state to a reverse bias state.

8. A method for producing an optical pulse comprising the steps of:
  forward biasing a step-recovery diode,
  transmitting a reverse current through the step-recovery diode to switch the step-recovery diode from a forward biased state to a reverse biased state, such that an abruptly rising reverse bias voltage develops across said step-recovery diode and
  applying said abruptly rising voltage across a series combination of a capacitor and a laser diode, said abruptly rising reverse bias voltage producing a current pulse through said laser diode, said current pulse causing said laser diode to emit an optical pulse.

* * * * *